(12) United States Patent
Redburn et al.

(10) Patent No.: US 6,288,917 B1
(45) Date of Patent: Sep. 11, 2001

(54) THREE STAGE POWER CONDITIONING CIRCUIT

(75) Inventors: James E. Redburn, Sugar Land, TX (US); Leonard E. Webster, Chicago, IL (US)

(73) Assignee: Leveler, Houston, TX (US)

( * ) Notice: Subject to any disclaimer, the term of this patent is extended or adjusted under 35 U.S.C. 154(b) by 0 days.

(21) Appl. No.: 09/456,101

(22) Filed: Dec. 6, 1999

Related U.S. Application Data

(63) Continuation-in-part of application No. 09/009,210, filed on Jan. 20, 1998, now Pat. No. 6,166,458.

(51) Int. Cl.[7] ............................................. H02J 1/02
(52) U.S. Cl. ................................................ 363/39; 307/105
(58) Field of Search ............................... 363/39; 307/105; 333/175, 176, 177, 178

(56) References Cited

U.S. PATENT DOCUMENTS

| | | | |
|---|---|---|---|
| 4,429,338 | 1/1984 | Becker et al. | 361/42 |
| 4,703,386 | 10/1987 | Speet et al. | 361/56 |
| 4,802,055 | 1/1989 | Beckerman | 361/56 |
| 4,814,941 | 3/1989 | Speet et al. | 361/334 |
| 4,868,732 | 9/1989 | Gillett et al. | 363/90 |
| 4,901,183 | 2/1990 | Lee | 361/56 |
| 4,999,729 | 3/1991 | Stifter | 361/56 |
| 5,105,327 | 4/1992 | Wohlforth | 361/56 |
| 5,162,963 | 11/1992 | Washburn et al. | 361/18 |
| 5,287,288 | 2/1994 | Brennen et al. | 364/483 |
| 5,355,025 | 10/1994 | Moran et al. | 307/105 |
| 5,448,443 | 9/1995 | Muelleman | 361/111 |
| 5,465,203 | 11/1995 | Bhattacharya et al. | 363/40 |
| 5,490,030 | 2/1996 | Taylor et al. | 361/45 |
| 5,589,718 | 12/1996 | Lee | 307/72 |
| 5,617,284 | 4/1997 | Paradise | 361/58 |
| 5,731,965 | * 3/1998 | Cheng et al. | 363/41 |
| 5,757,099 | * 5/1998 | Cheng et al. | 307/105 |
| 6,166,458 | * 12/2000 | Redburn et al. | 307/105 |

FOREIGN PATENT DOCUMENTS

WO 96/39735 12/1996 (WO).
WO 99/37007 7/1999 (WO).

* cited by examiner

*Primary Examiner*—Adolf Deneke Berhane
(74) *Attorney, Agent, or Firm*—Marshall, O'Toole, Gerstein, Murray & Borun

(57) ABSTRACT

A power conditioning circuit for conditioning power supplied by a power source at a nominal frequency over line, neutral and ground conductors includes first, second and third stages. The first stage provides voltage suppression and includes a set of three metal oxide varistors (MOVs). The second stage provides high frequency power suppression and includes three inductors coupled to the line, neutral and ground conductors, respectively, and to output lines. Each of the inductors prevents power at frequencies greater than the nominal frequency from reaching the output lines and each of the inductors may be rated to compensate for the capacitive impedance characteristics of a load supplied by the power conditioning circuit. The third stage provides voltage suppression and voltage clamping and includes an MOVs and a set of first and second rectifier diodes.

11 Claims, 2 Drawing Sheets

THREE STAGE POWER CONDITIONING CIRCUIT

RELATED APPLICATIONS

This application is a continuation-in-part of U.S. patent application Ser. No. 09/009,210, filed Jan. 20, 1998 now U.S. Pat. No. 6,166,458 published on Dec. 26, 2000.

TECHNICAL FIELD

The present invention relates generally to power conditioning circuits, and more particularly, to power conditioning circuits that protect attached load equipment from voltage and current surges due to, for example, lightning strikes or other power disturbances.

BACKGROUND ART

Power conditioning circuits have long been used to protect sensitive load equipment from transients caused by lightning strikes, noise and other power line disturbances. Traditionally, filter elements are used in the line and neutral conductors which trap and/or shunt unwanted power frequencies away from the load. See, for example, Speet et al. U.S. Pat. No. 4,814,941 and Taylor et al. U.S. Pat. No. 5,490,030.

Muelleman U.S. Pat. No. 5,448,443 discloses a power conditioning device and method including an isolation transformer having primary and secondary sides and a ground impedance connected between the secondary side of the isolation transformer at a safety ground and an earth ground. The Muelleman device prevents ground current loops by redirecting transient ground currents to neutral, but does not provide current limiting or noise suppression.

SUMMARY OF THE INVENTION

A power conditioning circuit is simple in design, yet effective to limit damaging transients.

More particularly, according to one aspect of the present invention, a power conditioning circuit for conditioning power supplied by a power source at a nominal frequency over line, neutral and ground conductors to first, second and third output lines, respectively, includes a first, second and third stage. The first stage is connected to the line, neutral and ground conductors, and is adapted to provide voltage suppression. The second stage is connected to the first stage, and includes first, second and third inductors coupled in series between the line, neutral and ground conductors, respectively, and the first, second and third output lines, respectively, and all of the power supplied by the power source to the first, second and third output lines flows through the first, second and third inductors. Each of the inductors block power at frequencies greater than the nominal frequency thereby to prevent power at frequencies greater than the nominal frequency from reaching the first, second and third output lines. The third stage is connected to the second stage and is further connected to the first, second and third output lines and is adapted to provide voltage suppression and voltage clamping.

According to another aspect of the present invention, the first stage includes first, second and third metal oxide varistors. The first metal oxide varistor is coupled between the line conductor and the neutral conductor and the second metal oxide varistor is coupled between the line conductor and the ground conductor and the third metal oxide varistor is coupled between the neutral conductor and the ground conductor.

Preferably, the first stage includes a capacitor coupled between the neutral conductor and the ground conductor.

According to yet another aspect of the present invention, the third stage includes a first metal oxide varistor, wherein the first metal oxide varistor is coupled between the neutral conductor and the ground conductor. The third stage may further include a second metal oxide varistor, wherein the second metal oxide varistor is coupled between the line conductor and the neutral conductor.

In addition to the foregoing, and according to a still further aspect of the present invention, the third stage includes first and second diodes coupled in anti-parallel relationship across the neutral conductor and the ground conductor. The third stage may further include a capacitor coupled between the neutral conductor and the ground conductor.

According to yet another aspect of the present invention, the first, second and third inductors are common mode inductors each having a core and a set of first and second windings. The first inductor is coupled between the line conductor and the first output line via the first winding of the first inductor and the first inductor is further coupled between the neutral conductor and the second output line via the second winding of the first inductor and the first and second windings of the first inductor are wound around the core of the first inductor. The second inductor is coupled between the neutral conductor and the second output line via the first winding of the second inductor and the second inductor is further coupled between the ground conductor and the third output line via the second winding of the second inductor and the first and second windings of the second inductor are wound around the core of the second inductor. The third inductor is coupled between the ground conductor and the third output line via the first winding of the third inductor and the third inductor is further coupled between the line conductor and the first output line via the second winding of the third inductor and the first and second windings of the third inductor are wound around the core of the third inductor. The first, second and third output lines of the power conditioning circuit of the present invention may be coupled to a load having a capacitive impedance and the first, second and third inductors may be rated to compensate for the capacitive impedance of the load.

Other aspects and advantages of the present invention will become apparent upon consideration of the following drawings and detailed description.

BRIEF DESCRIPTION OF THE PREFERRED EMBODIMENT

Figure 1:
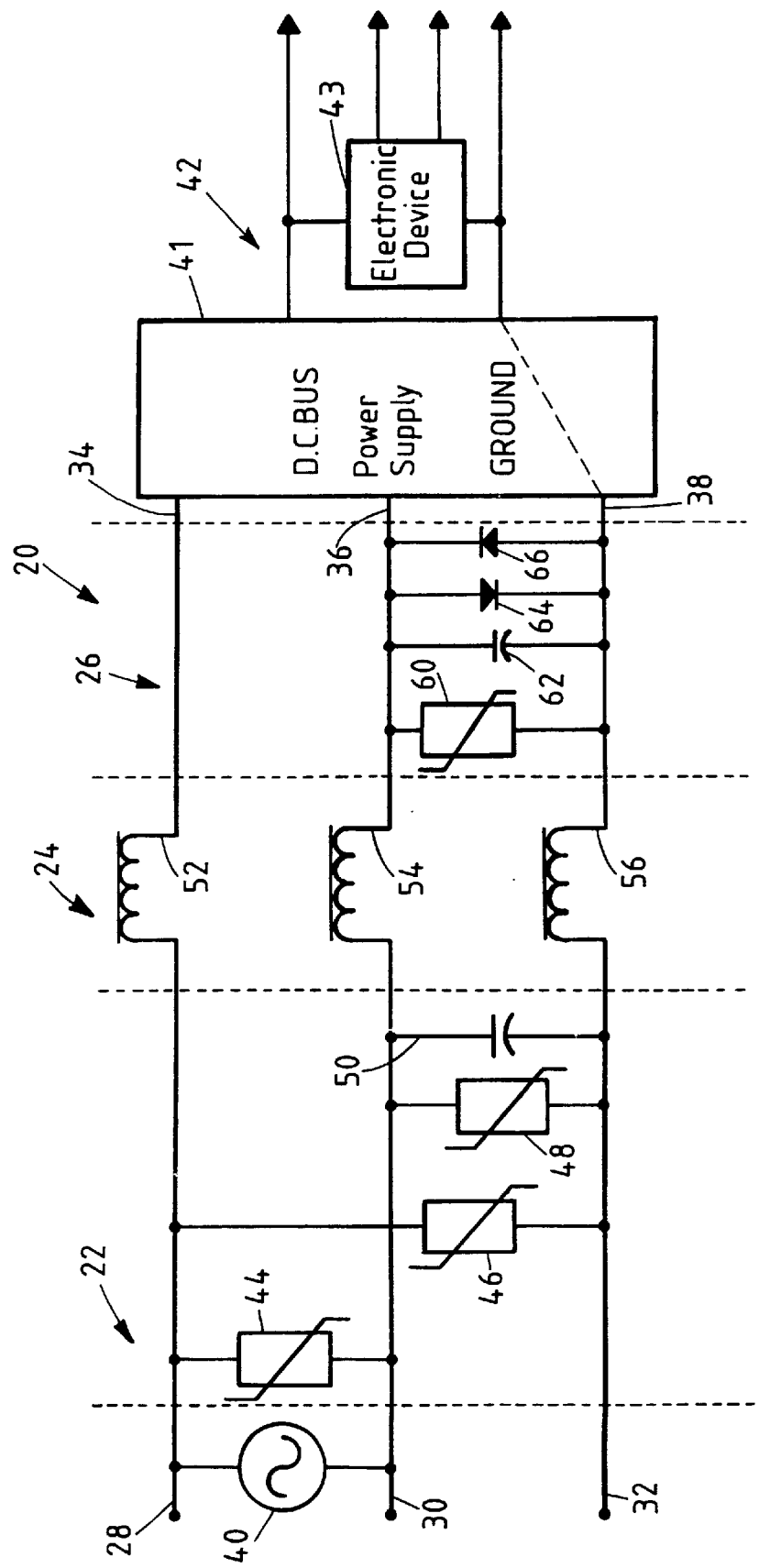
FIG. 1 comprises a schematic diagram of a first embodiment of the present invention.

Referring first to FIG. 1, a power conditioning circuit 20 having a set of first, second and third stages 22, 24 and 26 is connected between a set of line, neutral and ground conductors 28, 30, 32 and a set of output lines 34, 36, 38. The line, neutral and ground conductors 28, 30, 32 may be connected to a commercial source of power 40 or any other power source. The first, second and third stages 22, 24 and 26 are arranged such that power entering the power conditioning circuit from the power source 40 first flows through the first stage, then through the second stage and lastly the third stage. Upon exiting the third stage, the power reaches the output lines 34, 36 and 38 which are connected to the load(s) 42. The load(s) 42 may include, for example, a power supply 41 that is coupled to an electronic device 43, such as a computer.

The first stage 22 includes first, second and third metal oxide varistors (MOVs) 44, 46 and 48 connected across the line and neutral conductors 28, 30, the line and ground conductors 28, 32 and the neutral and ground conductors 30, 32, respectively. In addition, a first capacitor 50 that preferably, although not necessarily, has a rating of 25 microfarads is connected across the neutral and ground conductors 30, 32.

The second stage 24 includes first, second and third inductors 52, 54, 56 connected in series on each of the line, neutral and ground conductors 28, 30 and 32, respectively. The third stage 26 includes a fourth MOV 60 connected between neutral and ground conductors 30 and 32. In addition, a second capacitor 62 is coupled between neutral and ground conductors 30, 32 and first and second rectifier diodes 64, 66 are connected in anti-parallel relationship between the neutral and ground lines.

The first, second and third MOVs 44, 46, 48 of the first stage 22 limit the voltage magnitudes appearing across the line, neutral and ground conductors 28, 30, 32 by shunting currents during voltage spikes that exceed a threshold voltage. It is preferable, although not necessary, that the first, second and third MOV's each have a rating of 150 volts RMS.

The first, second, and third inductors 52, 54 and 56 have rating values that attenuate transients having one or more frequency components in excess of the nominal frequency (typically 60 Hz) of the power supplied via the line, neutral and ground conductors 22, 24, 26. It is preferable, although not necessary, that the inductors 52, 54 and 56 each have the rating of 5 millihenries (mh).

The third stage 26 suppresses substantially all undesired remaining energy components that are not diverted or attenuated by the first and second stages 22, 24. More particularly, the fourth MOV 60 limits the magnitude of the voltages appearing on the neutral and/or ground conductors 30 and 32 by shunting currents to ground. Because any high energy surges and high energy surge components have ideally been filtered by the first and second stages, the elements of the third stage need only be rated to divert or attenuate lower energy surges. As a result, the MOV 60 preferably, although not necessarily, has a rating of 140 V RMS. Likewise, the second capacitor 62, which operates to shunt power components having undesired frequencies to the ground conductor 32, preferably, although not necessarily, has a rating of 25 microfarads. The first and second rectifier diodes 64 and 66 are connected in parallel between the neutral and ground conductors 30, 32 such that the polarity of the first rectifier diode 64 opposes the polarity of the second rectifier diode 66. Arranging the rectifier diodes 64, 66 in this manner enables precise, low level voltage clamping, thereby further enabling voltage control for the load ground. In applications wherein the electronic device 43 of the load 42 is a computer, low level voltage clamping on the ground leg is especially advantageous because the ground lead attaches directly to the microprocessor and is, therefore, a potential source of damaging voltage spikes.

To provide power factor correction for a load having a capacitive impedance characteristic, such as a computer, and to thereby reduce power costs, the first, second and third inductors 52, 54, 56 of the second stage are preferably sized not only to dampen, or suppress high frequency spikes, but also to offset the capacitive impedance characteristics of the load. Thus, it is preferable to employ inductors 52, 54 and 56 having rating values that improve the overall power factor of the power supplied by the conditioning circuit to the capacitive load, i.e., it is desirable to obtain a power factor that approximates unity or comes as close thereto as practical.

The three stage power conditioning circuit described herein provides high quality, precise and yet inexpensive power conditioning. More particularly, by arranging the first, second and third stages 22, 24, 26 in a cascaded order such that the first and second stages 22 and 24 effect high energy suppression and isolation and the third stage 26 effects low energy transient noise suppression, less expensive circuit elements may be employed in each of the three stages. The cost savings achieved by way of the three stage power conditioning circuit of the present invention are best understood with reference to the rating of each of the circuit elements and a manufacturer specified tolerance level associated with each of the ratings. Specifically, the rating and tolerance level associated with each circuit element affects the cost of the circuit element such that circuit elements that are rated for higher voltage levels and/or current levels are typically more costly than circuit elements rated to handle lower levels. In addition, a circuit element having a wide tolerance associated with the rating is typically less precise and therefore less costly than a circuit element having a narrower, and thus, more precise tolerance associated with the rating. In the three stage power conditioning circuit of the present invention, the first and second stages 22, 24 are used to suppress and/or attenuate high energy transients and as a result the circuit elements of the first and second stages 22, 24 are preferably rated to handle these high energy surges. However, because of the back-up protection provided by the third stage 26, the circuit elements of the first and second stages 22, 24 need not be particularly precise and thus may have ratings with a wider tolerance level than would otherwise be effective to adequately protect the attached loads. Thus, the increased cost of providing circuit elements in the first and second stages 22, 24 that are capable of handling high energy surges is offset by the wider tolerance levels associated with the ratings. Conversely, because precise power conditioning is desired at the third stage 26, circuit elements having narrower tolerance levels are desirable. However, because the circuit elements of the third stage 26 need only be rated to perform low energy suppression/attenuation, the increased cost associated with a narrower tolerance level is offset by the decreased cost of the lower ratings associated with the circuit elements of the third stage 26.

Figure 2:
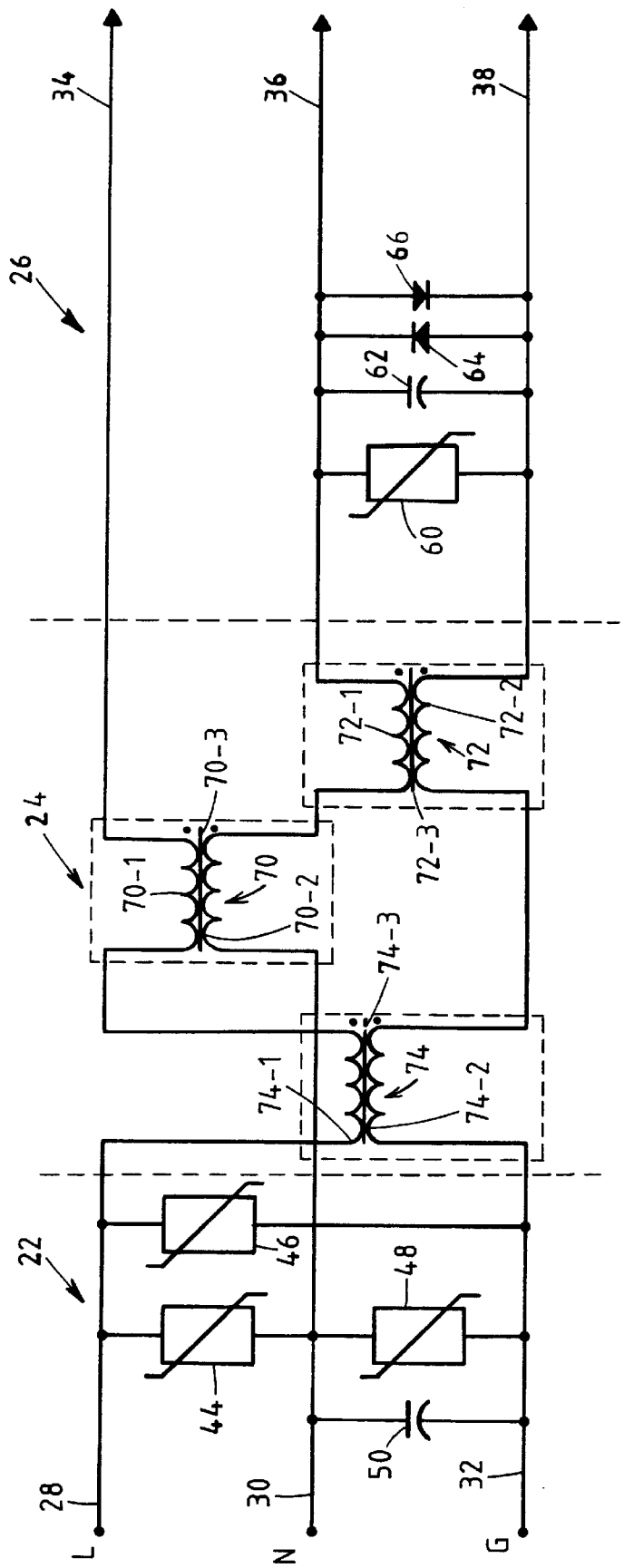
FIG. 2 comprises a schematic diagram of a second embodiment of the present invention.

Referring now to FIG. 2, to provide enhanced noise suppression, the second stage of the three stage power conditioning circuit may be modified to include common mode inductors 70, 72, 74 each having a first winding 70-1, 72-1 and 74-1 respectively, a second winding 70-2, 72-2 and 74-2 respectively, and a core 70-3, 72-3 and 74-3, respectively. The first winding 70-1 of the common mode inductor 70 is coupled in series with the first winding 74-1 of the common mode inductor 74 between line conductor 28 and the first output line 34, and the second winding 70-2 of the common mode inductor 70 is coupled in series between the neutral conductor 30 and the second output line 36. The second windings 72-2 and 74-2 of the common mode inductors 72, 74 are coupled in series between the ground conductor 32 and the third output line 38. The first and second windings 70-1 and 70-2 are wound on the core 70-3 while the first and second windings 72-1 and 72-2 are wound on the core 72-3 and the first and second windings 74-1 and 74-2 are wound on the core 74-3. Each of the common mode inductors 70, 72 and 74 are arranged such that the polarity of the windings of each of the inductors 70, 72 and 74 is identically aligned as indicated by the polarity dots shown beside each of the inductors 70, 72 and 74. By using common mode inductors arranged in this manner, high frequency transient voltages appearing across both the first and second windings 70-1, 70-2, 72-1, 72-2, 74-1, 74-2 of the first, second and third inductors 70, 72, and 74, respectively, simultaneously act to cancel each other out, thereby providing noise suppression.

Numerous modifications and alternative embodiments of the present invention will be apparent to those skilled in the art in view of the foregoing description. For example, the third stage of the power conditioning circuit may include an additional MOV (not shown) connected to the line conductor at a point between the line conductor 28 and the output line 34 and coupled between the line conductor 28 and the neutral conductor 30 to protect against a high power energy surge that reaches the third stage.

Accordingly, the description of the present invention is to be construed as illustrative only and is for the purpose of teaching those skilled in the art the best mode of carrying out the invention. The details of the structure and/or function may be varied substantially without departing from the spirit of the invention, and the exclusive use of all modifications which come within the scope of the appended claims is reserved.

What is claimed is:

1. A power conditioning circuit for conditioning power supplied by a power source at a nominal frequency over line, neutral and ground conductors to first, second and third output lines, respectively, comprising:
    a first stage connected to the line, neutral and ground conductors, wherein the first stage is adapted to provide voltage suppression;
    a second stage connected to the first stage, wherein the second stage comprises first, second and third inductors coupled in series between the line, neutral and ground conductors, respectively, and the first, second and third output lines, respectively, wherein all of the power supplied by the power source to the first, second and third output lines flows through the first, second and third inductors, each of the inductors blocking power at frequencies greater than the nominal frequency thereby to prevent power at frequencies greater than the nominal frequency from reaching the first, second and third output lines; and
    a third stage connected to the second stage and further connected to the first, second and third output lines, wherein the third stage is adapted to provide voltage suppression and voltage clamping.

2. The power conditioning circuit of claim 1, wherein the first stage comprises first, second and third metal oxide varistors, and further wherein the first metal oxide varistor is coupled between the line conductor and the neutral conductor and the second metal oxide varistor is coupled between the line conductor and the ground conductor and the third metal oxide varistor is coupled between the neutral conductor and the ground conductor.

3. The power conditioning circuit of claim 2, wherein the first stage further comprises a capacitor coupled between the neutral conductor and the ground conductor.

4. The power conditioning circuit of claim 1, wherein the third stage comprises a first metal oxide varistor, wherein the first metal oxide varistor is coupled between the neutral conductor and the ground conductor.

5. The power conditioning circuit of claim 4, wherein the third stage further comprises a second metal oxide varistor, wherein the second metal oxide varistor is coupled between the line conductor and the neutral conductor.

6. The power conditioning circuit of claim 4, wherein the third stage further comprises first and second diodes coupled in anti-parallel relationship across the neutral conductor and the ground conductor.

7. The power conditioning circuit of claim 6, wherein the first and second diodes comprise rectifier diodes.

8. The power conditioning circuit of claim 6, wherein the third stage further comprises a capacitor coupled between the neutral conductor and the ground conductor.

9. The power conditioning circuit of claim 1, wherein the first, second and third inductors are common mode inductors each having a core and a set of first and second windings and each of the windings having a polarity, and further wherein
    the first inductor is coupled between the line conductor and the first output line via the first winding of the first inductor and the first inductor is further coupled between the neutral conductor and the second output line via the second winding of the first inductor and the first and second windings of the first inductor are wound around the core of the first inductor; and
    wherein the second inductor is coupled between the neutral conductor and the second output line via the first winding of the second inductor and the second inductor is further coupled between the ground conductor and the third output line via the second winding of the second inductor and the first and second windings of the second inductor are wound around the core of the second inductor; and
    wherein the third inductor is coupled between the ground conductor and the third output line via the first winding of the third inductor and the third inductor is further coupled between the line conductor and the first output line via the second winding of the third inductor and the first and second windings of the third inductor are wound around the core of the third inductor; and
    wherein the polarity of each of the windings are aligned to thereby provide common mode noise suppression.

10. The power conditioning circuit of claim 9, wherein the first second and third output lines are coupled to a load having a capacitive impedance and further wherein the first, second and third inductors are rated to compensate for the capacitive impedance of the load.

11. The power conditioning circuit of claim 1, wherein the first, second and third output lines are coupled to a load having a capacitive impedance and further wherein the first, second and third inductors are rated to compensate for the capacitive impedance of the load.

* * * * *